US010269829B2

(12) United States Patent
Leng et al.

(10) Patent No.: US 10,269,829 B2
(45) Date of Patent: Apr. 23, 2019

(54) FLEXIBLE ARRAY SUBSTRATE WITH STRESS RELIEF LAYER OPENINGS

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Chuanli Leng, Shanghai (CN); Sera Kenji, Xiamen (CN); Haijing Chen, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/414,534

(22) Filed: Jan. 24, 2017

(65) Prior Publication Data

US 2017/0133408 A1    May 11, 2017

(30) Foreign Application Priority Data

Sep. 29, 2016    (CN) .......................... 2016 1 0871383

(51) Int. Cl.
*H01L 27/12*      (2006.01)
(52) U.S. Cl.
CPC ........ *H01L 27/1218* (2013.01); *H01L 27/124* (2013.01); *H01L 27/1255* (2013.01)

(58) Field of Classification Search
CPC ............... H01L 27/1218; H01L 27/124; H01L 27/1255
See application file for complete search history.

(56) References Cited

U.S. PATENT DOCUMENTS

| 2013/0193456 A1* | 8/2013 | Lee ...................... H01L 27/3213 257/88 |
| 2014/0037930 A1* | 2/2014 | Sun ......................... C03C 17/32 428/220 |
| 2015/0060778 A1 | 3/2015 | Kim et al. |

(Continued)

FOREIGN PATENT DOCUMENTS

| CN | 103700322 A | 4/2014 |
| CN | 104425550 A | 3/2015 |

*Primary Examiner* — Matthew C Landau
*Assistant Examiner* — Mark Hatzilambrou
(74) *Attorney, Agent, or Firm* — Kilpatrick Townsend & Stockton LLP

(57) ABSTRACT

An array substrate and a flexible display panel are provided. The array substrate includes a flexible substrate, a thin film transistor, a first metal layer, a second metal layer and a stacked structure including multiple inorganic layers. The thin film transistor includes a source, a drain, a channel and a gate. The gate of the thin film transistor is insulated from the source, the channel and the drain. The multiple inorganic layers include one or more buffer layers between the flexible substrate and the thin film transistor, one or more gate insulating layers between a channel area and the gate, and a first isolating layer between the thin film transistor and the second metal layer. At least one inorganic layer of the multiple inorganic layers has multiple openings at a position corresponding to a display area.

20 Claims, 13 Drawing Sheets

(56) References Cited

U.S. PATENT DOCUMENTS

2015/0108484 A1\* 4/2015 Park .................... H01L 27/1255
　　　　　　　　　　　　　　　　　　　　　　257/71
2015/0249096 A1\* 9/2015 Lupino ............. H01L 27/11898
　　　　　　　　　　　　　　　　　　　　　　257/203

\* cited by examiner

FLEXIBLE ARRAY SUBSTRATE WITH STRESS RELIEF LAYER OPENINGS

CROSS REFERENCE OF RELATED APPLICATION

The present application claims the priority to Chinese Patent Application No. 201610871383.9, titled "ARRAY SUBSTRATE AND DISPLAY PANEL", filed on Sep. 29, 2016 with the State Intellectual Property Office of the PRC, which is incorporated herein by reference in its entirety.

FIELD

The present disclosure relates to the field of display technology, and in particular to an array substrate and a display panel including the array substrate.

BACKGROUND

With the development of the display technology, a flexible display panel has been widely applied. The flexible display panel in the conventional technology includes a flexible substrate and an inorganic layer such as a buffer layer on one side of the flexible substrate, a TFT and a light-emitting element. Specifically, the inorganic layer is bent accordingly when the flexible display panel is bent, thereby resulting in stress defect, and affecting normal operation of the TFT and the light-emitting element.

SUMMARY

In order to solve the problem described above, an array substrate and a display panel including the array substrate are provided according to the embodiments of the present disclosure, to solve the problem that the normal operation of the TFT and the light-emitting element are affected when the display panel is bent.

In order to solve the problem described above, the embodiments in accordance with the present disclosure provide technical solutions as follows.

An array substrate is provided, which includes a flexible substrate, a thin film transistor, a first metal layer, a second metal layer and a stacked structure. The thin film transistor is arranged on a first side of the flexible substrate, the thin film transistor includes a source, a drain, a channel and a gate. The gate of the thin film transistor is insulated from the source, the channel and the drain. The first metal layer includes gate lines electrically connected with the gates. The second metal layer is arranged on a side of the thin film transistors away from the flexible substrate. The second metal layer includes multiple metal lines, and the multiple metal lines includes data lines. The data lines are electrically connected with the source or the drain and intersect with the gate lines in an insulative manner to define multiple display pixels, the data lines are configured to provide a data signal to the display pixels. And the stacked structure is arranged on the first side of the flexible substrate and covering a surface of the first side of the flexible substrate, the stacked structure includes multiple inorganic layers, the multiple inorganic layers include one or more buffer layers arranged between the flexible substrate and the thin film transistor, one or more gate insulating layers arranged between a channel area and the gate, and a first isolating layer arranged between the thin film transistor and the second metal layer. At least one inorganic layer of the multiple inorganic layers has multiple openings at a position corresponding to a display area.

A flexible display panel is provided, which includes the array substrate described above.

Compared with the conventional technology, the technical solutions described above have advantages as follows.

In the array substrate provided according to the embodiment of the present disclosure, at least one inorganic layer of the multiple inorganic layers has multiple openings at a position corresponding to a display area, so as to reduce stress accumulation in the stacked structure when the array substrate is bent, and release a part of stress by the openings, thereby solving a problem that the normal operation of the TFT and the light-emitting element is affected when the display panel including the array substrate is bent. The surface of the first side of the flexible substrate is completely covered by the stacked structure. That is, any position on the surface of the flexible substrate is covered by the stacked structure, and no exposed area exists, so as to isolate the flexible substrate from water and oxygen in the external environment with the stacked structure, and avoid the display panel including the array substrate from being unable to operate normally since that water and oxygen in the external environment enters into the display area of the display panel.

BRIEF DESCRIPTION OF THE DRAWINGS

In order to more clearly illustrate the technical solution in the embodiments of the present disclosure or in the conventional technology, drawings required in the description of the embodiments or the conventional technology are introduced simply below. Apparently, the drawings in the following description show some embodiments of the disclosure. For those skilled in the art, other drawings can also be obtained according to the drawings without any creative work.

DETAILED DESCRIPTION OF EMBODIMENTS

Hereinafter, the technical solutions in the embodiments described in the present disclosure will be described clearly and completely in conjunction with the drawings in the embodiments described in the present disclosure. Apparently, the described embodiments are only a part of embodiments that can be achieved in accordance with the present disclosure, rather than all the embodiments. All the other embodiments obtained by those skilled in the art based on the embodiments described in the present disclosure without creative work will fall within the scope of protection of the present disclosure.

Specific details are described in the following description, so that the present disclosure can be understood fully. However, the present disclosure may also be embodied in other ways, and similar extension can be made by those skilled in the art without departing from intension of the present disclosure. Therefore, the present disclosure is not limited to the specific embodiments described below.

Figure 1:
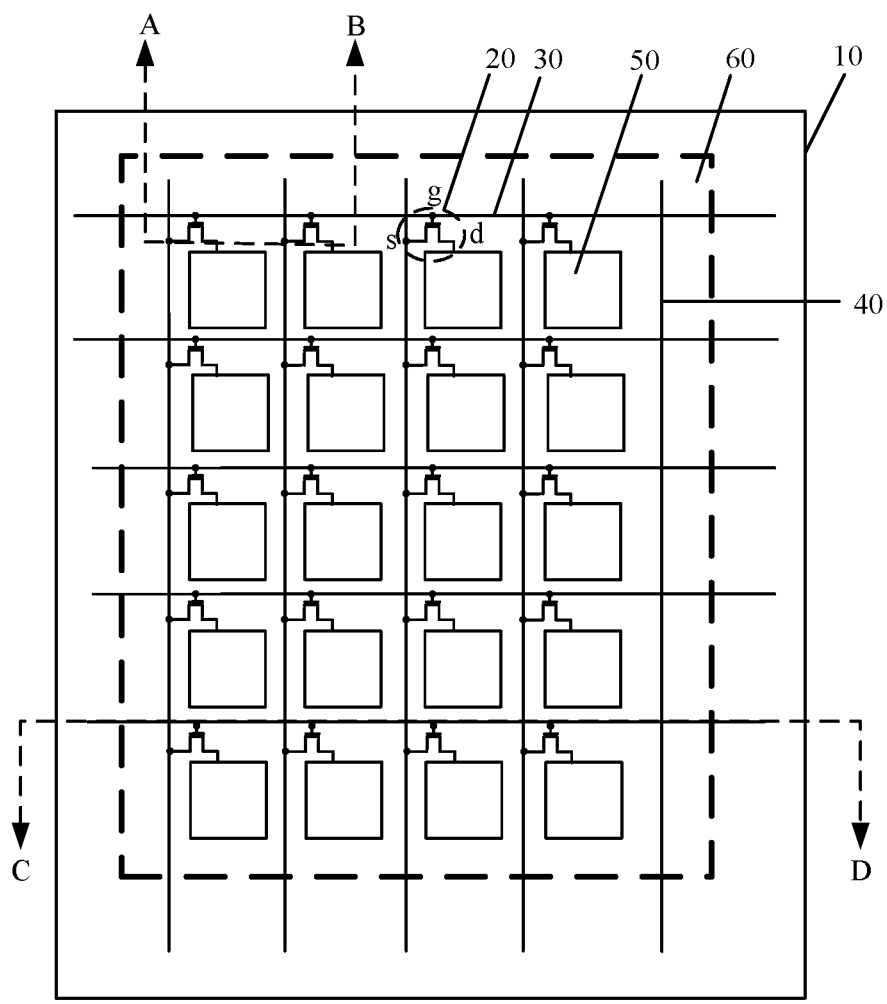
FIG. 1 is a plan view of an array substrate according to an embodiment in accordance with the present disclosure.
Figure 2:
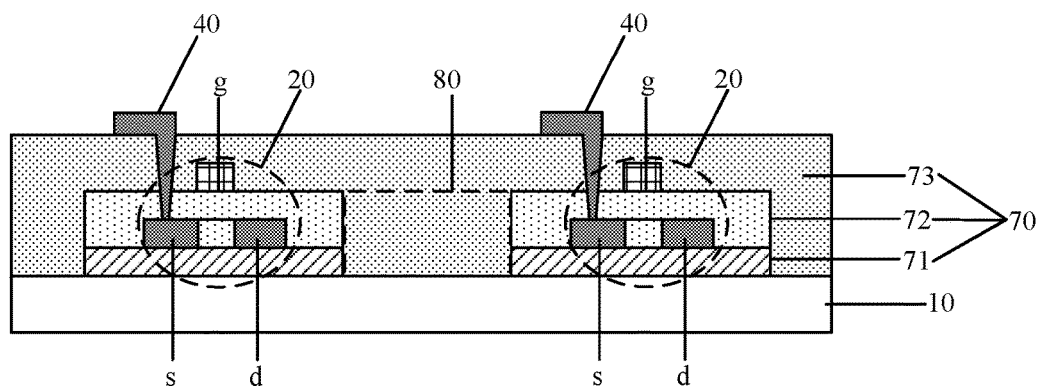
FIG. 2 is a section diagram of FIG. 1 along AB direction according to an embodiment in accordance with the present disclosure.

An array substrate is provided according to an embodiment in accordance with the present disclosure, as shown in FIG. 1 and FIG. 2, FIG. 1 is a plan view of an array substrate according to an embodiment in accordance with the present disclosure, and FIG. 2 is a section diagram of FIG. 1 along AB direction. It should be illustrated that, in the plan view of FIG. 1, a layer structure such as a first metal layer and a second metal layer shown in the section diagram of FIG. 2 can not be shown, electrode lines included in the first metal layer and the second metal layer can be shown, therefore a reference sign 30 of the first metal layer is labeled at gate lines included in the first metal layer and a reference sign 40 of the second metal layer is labeled at data lines included in the second metal layer in FIG. 1.

Specifically, the array substrate includes: a flexible substrate 10, a thin film transistor 20, a first metal layer 30, a second metal layer 40 and a stacked structure 70. The thin film transistor 20 is arranged on a first side of the flexible substrate 10, where the thin film transistor 20 includes a source s, a drain d, a channel and a gate g. The gate g is insulated from the source s, the channel and the drain d, the channel is arranged between the source s and the drain d. The first metal layer 30 includes gate lines electrically connected with the gates g. The second metal layer 40 is arranged on a side of the thin film transistor 20 away from the flexible substrate 10, where the second metal layer 40 includes multiple metal lines, and the multiple metal lines includes data lines, the data lines are electrically connected with the source s or the drain d, the data lines intersect with the gate lines in an insulative manner to define multiple display pixels 50, the data lines are configured to provide a data signal to the display pixels 50. The stacked structure 70 is arranged on the first side of the flexible substrate 10 and covering a surface of the first side of the flexible substrate 10, where the stacked structure 70 includes multiple inorganic layers, where the multiple inorganic layers include one or more buffer layers 71 arranged between the flexible substrate 10 and the thin film transistor 20, one or more gate insulating layers 72 arranged between a channel area and the gate g, and a first isolating layer 73 arranged between the thin film transistor 20 and the second metal layer 40. The buffer layer 71 is configured to isolate the substrate 10 from the thin film transistor 20 and protect the thin film transistor. The gate insulating layer 72 is configured to electrically insulate the channel from the gate. The first isolating layer 73 is configured to electrically insulate the first metal layer 30 from the second metal layer 40. And at least one inorganic layer of the multiple inorganic layers has multiple openings 80 at a position corresponding to a display area 60.

It should be understood that although in the array substrate shown in FIG. 1 and FIG. 2, the data line is electrically connected with the source s, there is one buffer layer 71 between the flexible substrate 10 and the thin film transistor 20, there is one gate insulating layer 72 between the gate g and the source s, the drain d and the channel, which are not limited in the present disclosure. In another embodiment, the data line may be electrically connected with the drain d, there may be multiple buffer layers 71 between the flexible substrate 10 and the thin film transistor 20, there may be multiple gate insulating layers 72 between the gate g and the source s, the drain d and the channel, as the case may be.

In the array substrate provided according to the embodiment in accordance with the present disclosure, at least one inorganic layer of the multiple inorganic layers has multiple openings 80 at a position corresponding to the display area 60, so as to reduce stress accumulation in the stacked structure 70 when the array substrate is bent, and release a part of stress by the openings 80, thereby solving the problem that normal operation of a TFT and a light-emitting element is affected when the display panel including the array substrate is bent. The surface of the first side of the flexible substrate 10 is completely covered by the stacked structure 70. That is, any position of the display area on the surface of the flexible substrate 10 is covered by the stacked structure 70, and no exposed area exists, so as to isolate the flexible substrate from water and oxygen in the external environment with the stacked structure 70, and avoid the display panel including the array substrate from being unable to operate normally since that water and oxygen in the external environment enters into the display area of the display panel.

It should also be understood that in this embodiment in accordance with the present disclosure, in a case that the inorganic layer has the opening 80, the opening 80 may be a recess in the inorganic layer where the opening 80 is arranged (that is, the opening 80 does not run through the inorganic layer where the opening 80 is arranged), or may also be a through hole which runs through the inorganic layer where the opening 80 is arranged, which is not limited in the present disclosure, as the case may be.

In a case that the opening 80 of the inorganic layer is the through hole which runs through the inorganic layer where the opening 80 is arranged, at least one inorganic layer of the multiple inorganic layers does not have an opening at any position corresponding to the display area of the flexible substrate 10, so that no exposed area exists in the display area on the surface of the flexible substrate 10. In a case that the opening 80 of the inorganic layer is the recess in the inorganic layer where the opening 80 is arranged, for any position corresponding to the display area of the flexible substrate 10, one part of the inorganic layers have openings, and the other part of the inorganic layers does not have an opening, alternatively, all of the inorganic layers may have openings, to release stress accumulation in each of the multiple inorganic layers, which is not limited in the present disclosure, as the case may be.

Based on any one embodiment described above, in an embodiment shown in FIG. 3, at least one buffer layer 71 has an opening 80, a front projection of the opening 80 of the buffer layer 71 on a plane where the array substrate is arranged does not overlap with a front projection of the thin film transistor 20 on the plane where the array substrate is arranged, to ensure protection of the buffer layer 71 for the thin film transistor 20.

Figure 3:
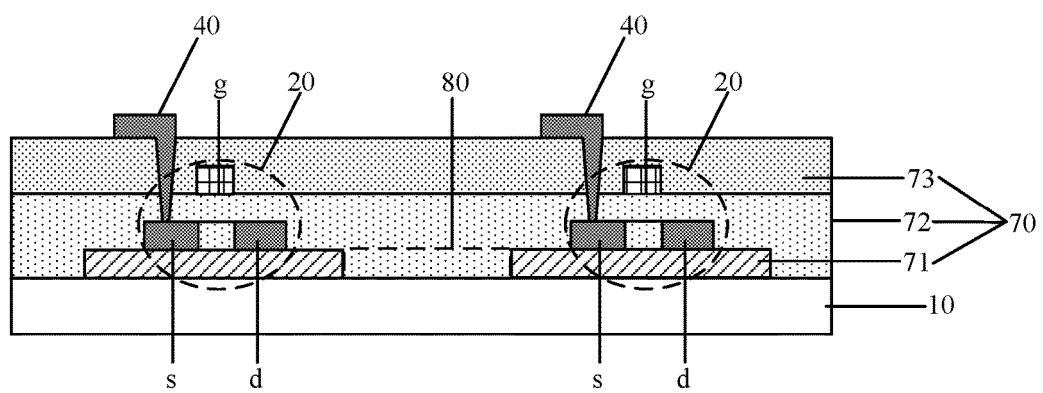
FIG. 3 is a section diagram of FIG. 1 along AB direction according to an embodiment in accordance with the present disclosure.
Figure 4:
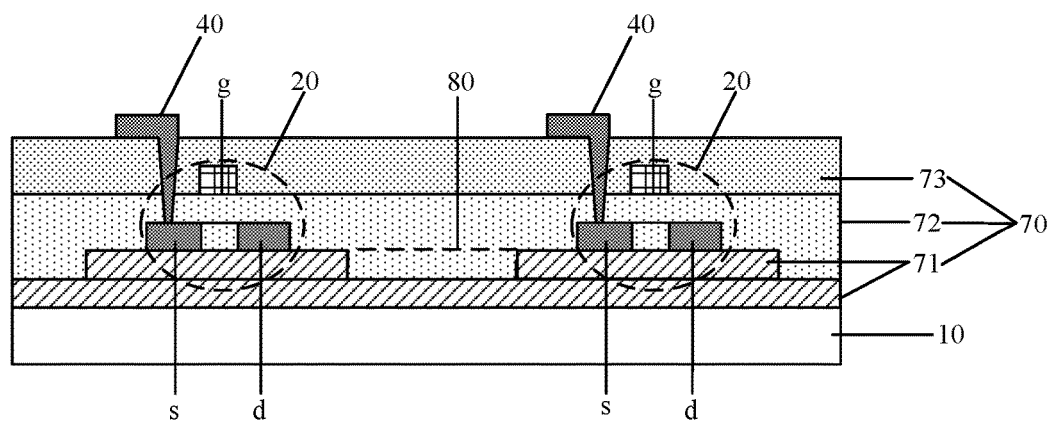
FIG. 4 is a section diagram of FIG. 1 along AB direction according to an embodiment in accordance with the present disclosure.
Figure 5:
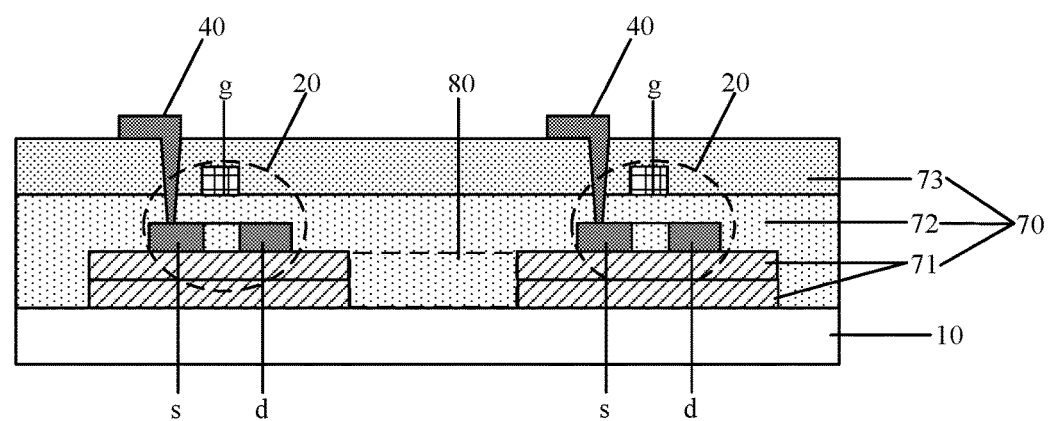
FIG. 5 is a section diagram of FIG. 1 along AB direction according to an embodiment in accordance with the present disclosure.

It should be understood that, in the embodiments described above, the stacked structure 70 may have one buffer layer 71 as shown in FIG. 3. Alternatively, the stacked structure 70 may have multiple buffer layers 71 as shown in FIG. 4 and FIG. 5. In a case that the stacked structure 70 has one buffer layer 71, the buffer layer 71 has an opening 80, as shown in FIG. 3. In a case that the stacked structure 70 has multiple buffer layers 71, only one buffer layer 71 of the multiple buffer layers 71 may have an opening 80. Alternatively, one part of the multiple buffer layers 71 have openings 80, and the other part of the multiple buffer layers 71 does not have an opening 80, as shown in FIG. 4, alternatively, all of the buffer layers 71 have openings 80, as shown in FIG. 5, which is not limited in the present disclosure, as the case may be.

Figure 6:
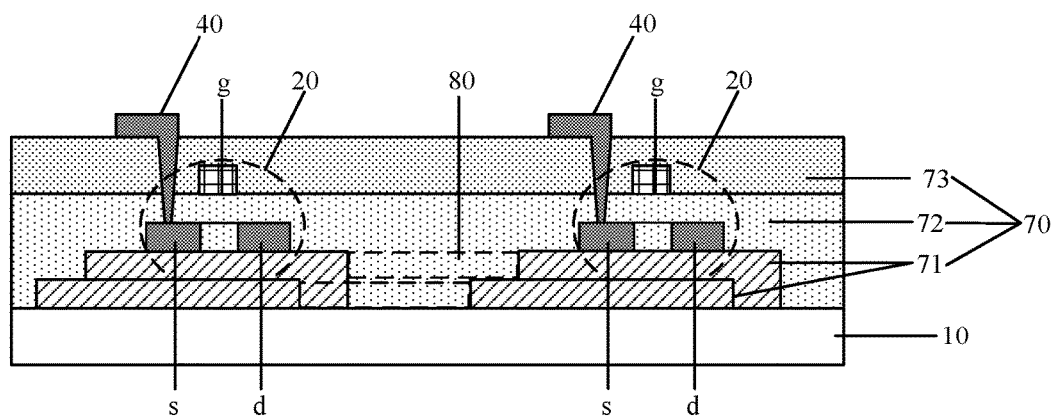
FIG. 6 is a section diagram of FIG. 1 along AB direction according to an embodiment in accordance with the present disclosure.
Figure 7:
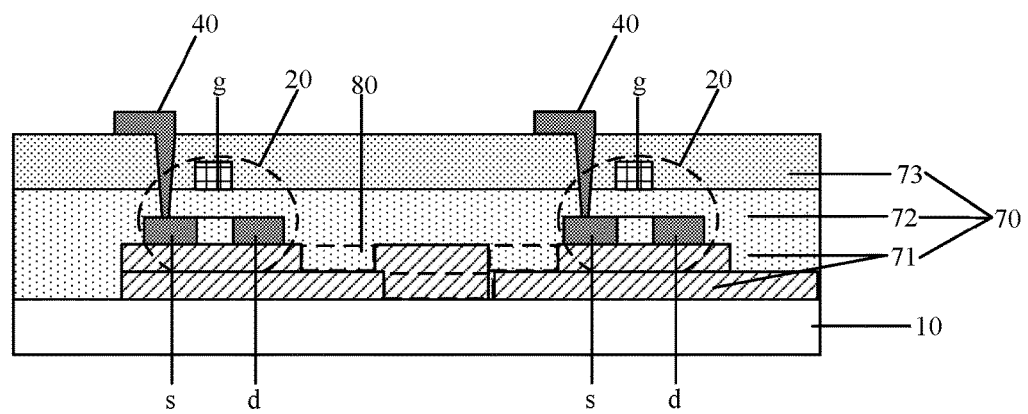
FIG. 7 is a section diagram of FIG. 1 along AB direction according to an embodiment in accordance with the present disclosure.

It should also be understood that in the embodiments described above, in a case that the stacked structure 70 has multiple buffer layers 71, and at least two buffer layers 71 of the multiple buffer layers 71 have openings 80, front projections of the openings 80 of the different buffer layers 71 on the plane where the array substrate is arranged may superpose with each other as shown in FIG. 5, or may overlap partially as shown in FIG. 6, or may not overlap as shown in FIG. 7, which is not limited in the present disclosure, as the case may be.

In a case that the stacked structure 70 has multiple buffer layers 71, although a crack is generated in a buffer layer 71 arranged on a side of the stacked structure 70 close to the flexible substrate 10 due to a large stress, the crack is difficult to be extended to an area above the buffer layer 71. Therefore, based on any one embodiment described above, in an optional embodiment, in a case that the stacked structure 70 has multiple buffer layers 71, and one part of the buffer layers 71 have openings 80, and the other part of the buffer layers 71 does not have an opening 80, the buffer layer 71 having the opening 80 may be arranged on a side of the multiple buffer layers 71 close to the thin film transistor 20, as shown in FIG. 4.

Figure 8:
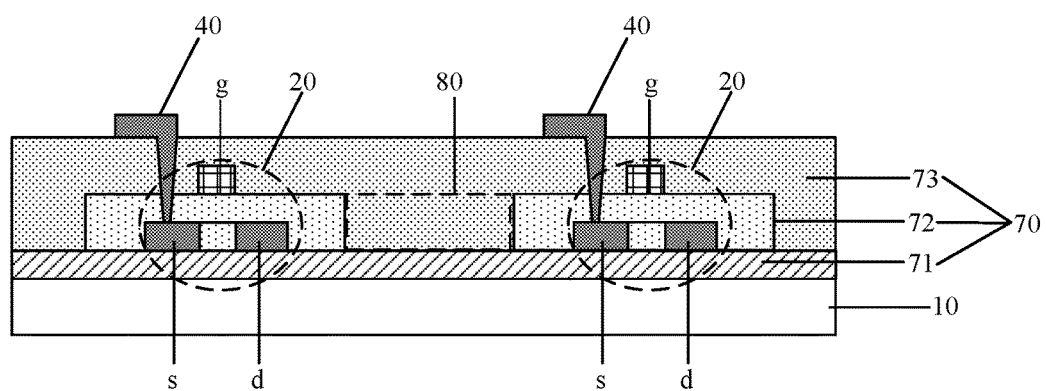
FIG. 8 is a section diagram of FIG. 1 along AB direction according to an embodiment in accordance with the present disclosure.

Based on any one embodiment described above, in an embodiment of the present disclosure, as shown in FIG. 8, at least one gate insulating layer 72 has an opening 80, a front projection of the opening 80 of the gate insulating layer 72 on the plane where the array substrate is arranged does not overlap with a front projection of the thin film transistor 20 on the plane where the array substrate is arranged, to insulate the gate g from the source s, the drain d and the channel with the gate insulating layer 72.

Based on the embodiments described above, the stacked structure 70 has one gate insulating layer 72 in an embodiment in accordance with the present disclosure, and the stacked structure 70 has multiple gate insulating layers 72 in another embodiment of the present disclosure, which is not limited in the present disclosure, as the case may be.

It should be understood that in a case that the stacked structure 70 has multiple gate insulating layers 72, one part of the multiple gate insulating layers 72 may have openings 80, and the other part of the gate insulating layers 72 does not have an opening 80, alternatively, all of the gate insulating layers 72 have openings 80, which is not limited in the present disclosure, as the case may be.

It should be understood that in a case that at least two gate insulating layers 72 of the gate insulating layers 72 have openings 80, front projections of the openings 80 of the different gate insulating layers 72 on the plane where the array substrate is arranged may not overlap with each other, or may overlap partially, or may superpose completely, which is not limited in the present disclosure, as the case may be.

Figure 9:
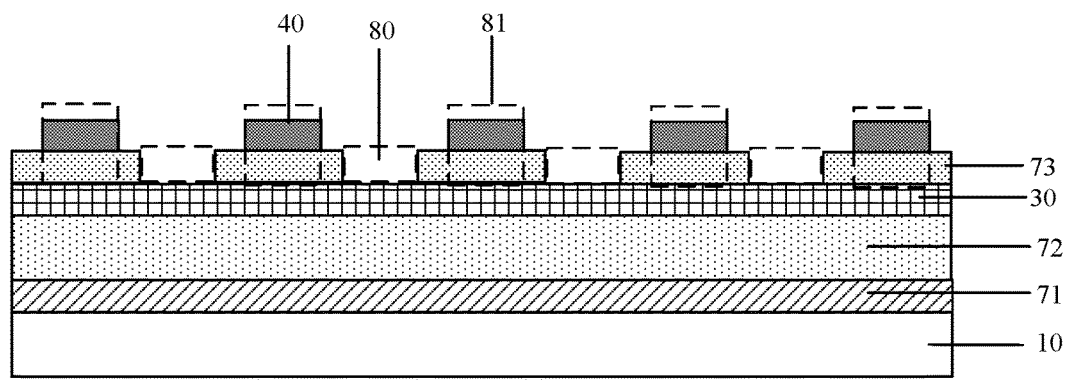
FIG. 9 is a section diagram of FIG. 1 along CD direction according to an embodiment in accordance with the present disclosure.

Based on any embodiment described above, in an embodiment in accordance with the present disclosure, as shown in FIG. 9, FIG. 9 is a section diagram of FIG. 1 along CD direction, at least one first isolating layer 73 has an opening 80, in the embodiment of the present disclosure, the first metal layer 30 and the second metal layer 40 have an overlapped area 81 in which the first metal layer 30 and the second metal layer 40 are overlapped with each other in a direction perpendicular with the plane where the array substrate is arranged, a front projection of the opening 80 of the first isolating layer 73 on the plane where the array substrate is arranged does not overlap with a front projection of the first overlapped area 81 on the plane where the array substrate is arranged, so as to isolate the first metal layer 30 from the second metal layer 40 with the first isolating layer 73 in an insulative manner.

It should be understood that, in the embodiment described above, there may be one or more first isolating layers 73 between the first metal layer 30 and the second metal layer 40, which is not limited in the present disclosure, as the case may be.

In the embodiment described above, in a case that there are multiple first isolating layers 73 between the first metal layer 30 and the second metal layer 40, one part of the first isolating layers 73 may have openings 80, and the other part of the first isolating layers 73 may not have an opening 80. Optionally, in a case that at least two first isolating layers 73 of the multiple first isolating layers 73 have openings 80, front projections of the openings 80 of the different first isolating layers 73 on the plane where the array substrate is arranged may not overlap with each other, or may overlap partially, or may superpose completely.

Figure 10:
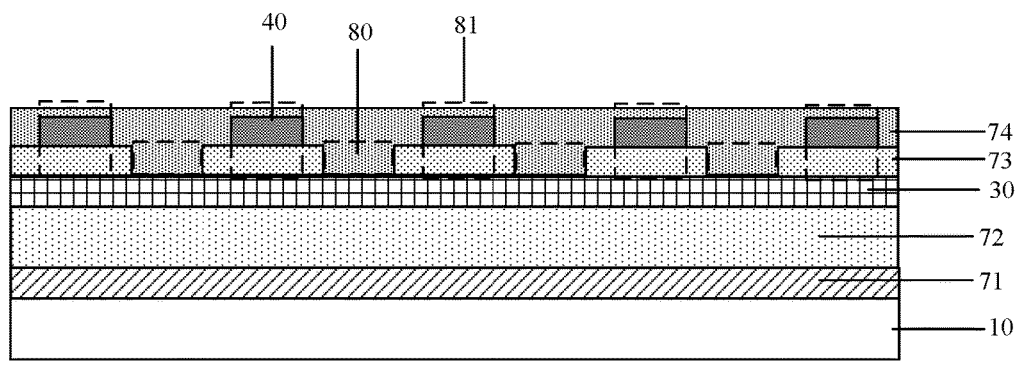
FIG. 10 is a section diagram of FIG. 1 along CD direction according to an embodiment in accordance with the present disclosure.

Based on the embodiment described above, in an embodiment in accordance with the present disclosure, as shown in FIG. 10, one or more passivation layers 74 covering the second metal layer 40 are arranged on a side of the second metal layer 40 away from the first isolating layer 73. Preferably, the passivation layers 74 may also be an inorganic layer in the stacked structure 70.

Figure 11:
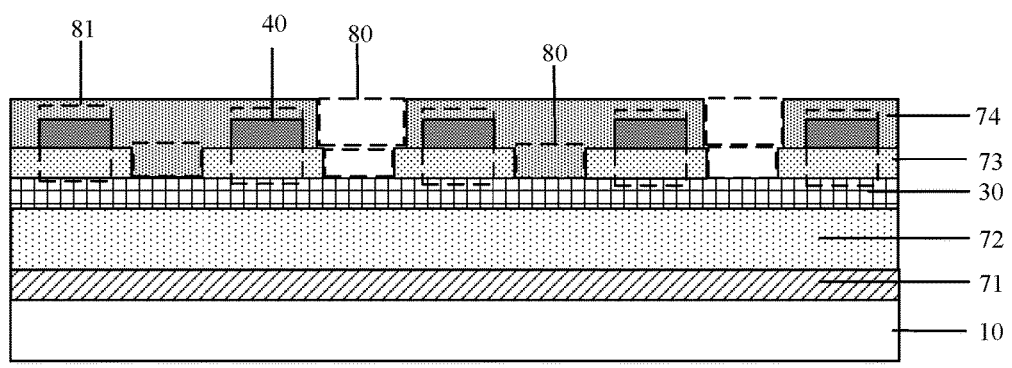
FIG. 11 is a section diagram of FIG. 1 along CD direction according to an embodiment in accordance with the present disclosure.

Based on the embodiment described above, in an embodiment in accordance with the present disclosure, as shown in FIG. 11, at least one passivation layer 74 has an opening 80, to further reduce stress accumulation in the stacked structure 70. It should be understood that in the embodiment of the present disclosure, a front projection of the opening 80 of the passivation layer 74 on the plane where the array substrate is arranged does not overlap with a front projection of multiple metal lines of the second metal layer 40 on the plane where the array substrate is arranged, to cover the multiple metal lines of the second metal layer with the passivation layer 74.

Figure 12:
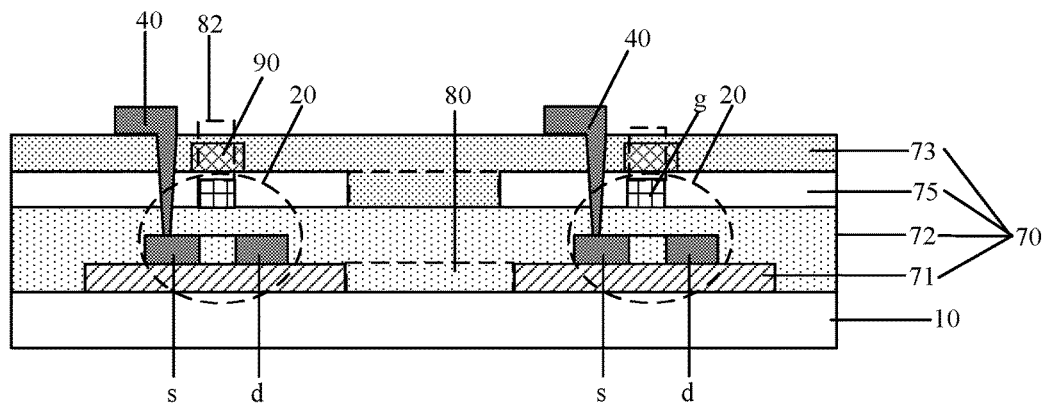
FIG. 12 is a section diagram of FIG. 1 along AB direction according to an embodiment in accordance with the present disclosure.

Based on any one embodiment described above, in an embodiment in accordance with the present disclosure, as shown in FIG. 12, the array substrate further includes a second isolating layer 75 and a capacitance metal layer 90. The second isolating layer 75 is arranged between the gate g and the first isolating layer 73. The capacitance metal layer 90 is arranged between the first isolating layer 73 and the second isolating layer 75, the capacitance metal layer 90 and the gate lines form capacitance, to be served as a pixel storage capacitance of the array substrate.

Specifically, the first metal layer 30 and the capacitance metal layer 90 have a second overlapped area 82 in which the first metal layer 30 and the capacitance metal layer 90 are overlapped with each other in a direction perpendicular with the array substrate. The second isolating layer 75 has an opening 80, and a front projection of the opening 80 on the plane where the array substrate is arranged does not overlap with a front projection of the second overlapped area 82 on the plane where the array substrate is arranged, to isolate the first metal layer 30 from the capacitance metal layer 90 with the second isolating layer 75 in an insulative manner. Preferably, the second isolating layer 75 may also be an inorganic layer in the stacked structure 70.

Based on any one embodiment described above, at least two inorganic layers of the multiple inorganic layers have openings in an optional embodiment of the present disclosure, it should be illustrated that at least two inorganic layers of the multiple inorganic layers having the openings are different types of inorganic layers in the embodiment of the present disclosure. Taking a case that two inorganic layers of the multiple inorganic layers have openings as an example, the two inorganic layers having the openings may be the buffer layer 71 and the gate insulating layer 72, or the buffer layer 71 and the first isolating layer 73, or the gate insulating layer 72 and the first isolating layer 73, or may be other two different types of inorganic layers, to further reduce stress accumulation in the stacked structure 70.

It should be understood that in the embodiments described above, in an optional embodiment of the present disclosure, in a case that at least two inorganic layers of the multiple inorganic layers have openings, there is not an area in which all front projections of the openings of the inorganic layers on the plane where the array substrate is arranged are overlapped with each other. For example, in a case that two inorganic layers of the multiple inorganic layers have openings, front projections of the openings of the two inorganic layers on the plane where the array substrate is arranged does not overlap with each other. In a case that three inorganic layers of the multiple inorganic layers have openings, front projections of the openings of any two of the three inorganic layers on the plane where the array substrate is arranged may overlap with each other, and there is not an area in which front projections of the openings of the three inorganic layers on the plane where the array substrate is arranged are overlapped with each other. In a case that four inorganic layers of the multiple inorganic layers have openings, front projections of the openings of any two of the four inorganic layers on the plane where the array substrate is arranged may have an overlapped area in which the front projections of the openings of the two of the four inorganic layers are overlapped with each other, or front projections of the openings of any three of the four inorganic layers on the plane where the array substrate is arranged may have an overlapped area in which the front projections of the openings of the three of the four inorganic layers are overlapped with each other, and there is not an area in which front projections of the openings of the four inorganic layers on the plane where the array substrate is arranged are overlapped with each other, and so forth.

Based on the embodiments described above, in an embodiment of the present disclosure, in a case that at least two inorganic layers of the multiple inorganic layers have openings, the at least two inorganic layers includes at least one buffer layer 71 and at least one gate insulating layer 72, a front projection of each of the openings of the buffer layer 71 and the gate insulating layer 72 on the plane where the array substrate is arranged does not overlap with a front projection of the thin film transistor 20 on the plane where the array substrate is arranged, so as to support the thin film transistor 20 and isolate the thin film transistor 20 from water and oxygen with the buffer layer 71, and isolate the gate g from the source s, the drain d and the channel with the gate insulating layer 72 in an insulative manner.

Based on the embodiments described above, in an embodiment of the present disclosure, the at least two inorganic layers further include at least one first isolating layer 73, to further reduce stress accumulation in the stacked structure 70. Specifically, the first metal layer 30 and the second metal layer 40 have a first overlapped area 81 in which the first metal layer 30 and the second metal layer 40 are overlapped with each other in a direction perpendicular with the plane where the array substrate is arranged, and a front projection of an opening 80 of the first isolating layer 73 on the plane where the array substrate is arranged does not overlap with a front projection of the first overlapped area 81 on the plane where the array substrate is arranged, to isolate the first metal layer 30 from the second metal layer 40 with the first isolating layer 73 in an insulative manner.

Figure 13:
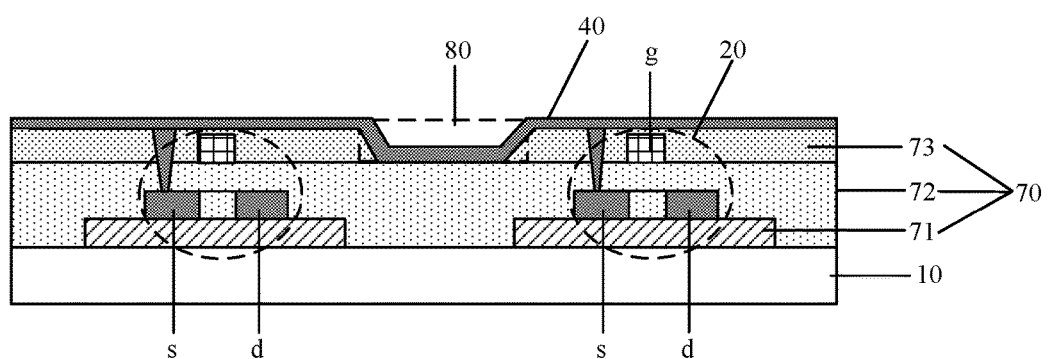
FIG. 13 is a section diagram of FIG. 1 along AB direction according to an embodiment in accordance with the present disclosure.

It should be understood that in a case that the first isolating layer 73 has an opening 80, optionally, as shown in FIG. 13, a section shape of the opening 80 of the first isolating layer 73 is a trapezoid, a length of a bottom side of the trapezoid close to the second metal layer 40 is greater than a length of a bottom side of the trapezoid close to the thin film transistor 20, so that a section of the second metal layer 40 on a surface of the first isolating layer 73 at the opening 80 is in a shape of trapezoid, to greatly relieve bending stress of the second metal layer 40 when the array substrate is bent.

Based on any one embodiment described above, in an embodiment in accordance with the present disclosure, any one inorganic layer of the multiple inorganic layers may be a silicon oxide layer, or may be a silicon nitride layer, or may be a laminated layer in which the silicon oxide layer and the silicon nitride layer are arranged alternately, which is not limited in the present disclosure, as the case may be.

As shown in FIG. 14 to FIG. 18, in some embodiments in accordance with the present disclosure, the display panel includes: a flexible substrate 10, a thin film transistor 20, a first metal layer 30, a second metal layer 40 and a stacked structure. The thin film transistor 20 is arranged on a first side of the flexible substrate 10, where the thin film transistor 20 includes a source s, a drain d, a channel and a gate g. The gate is insulated from the source s, the channel and the drain d, the channel is arranged between the source s and the drain d. The first metal layer 30 includes gate lines electrically connected with the gate g. The second metal layer 40 is arranged on a side of the thin film transistor 20 away from the flexible substrate 10, the second metal layer 40 includes multiple metal lines, the multiple metal lines include data lines, the data lines are electrically connected with the source s or the drain d, the data lines intersect with the gate lines in an insulative manner to define multiple display pixels 50, the data lines are configured to provide a data signal to the display pixels 50. The stacked structure (not shown) is arranged on a first side of the flexible substrate 10 and covering a surface of the first side of the flexible substrate 10, the stacked structure (not shown) includes multiple inorganic layers, the multiple inorganic layers include one or more buffer layers arranged between the flexible substrate 10 and the thin film transistor 20, one or more gate insulating layers arranged between the channel area and the gate g, and a first insolating layer arranged between the thin film transistor 20 and the second metal layer 40, where at least one inorganic layer of the multiple inorganic layers has multiple openings 80 at a position corresponding to a display area 60.

Figure 14:
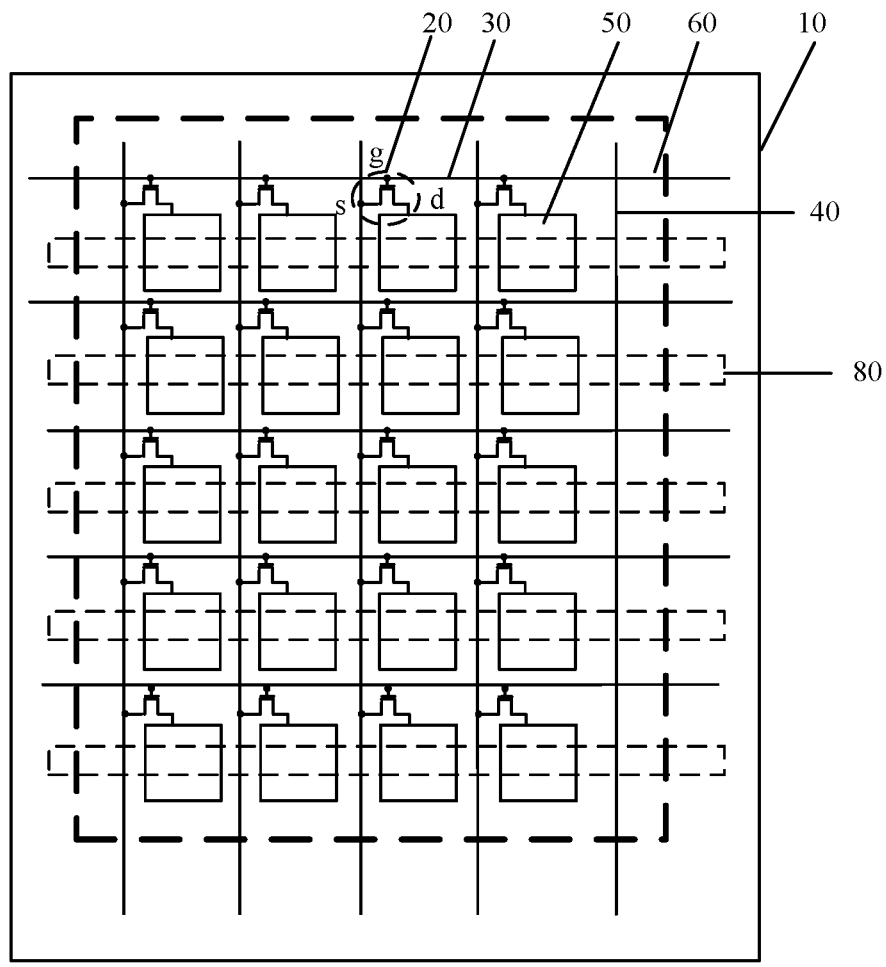
FIG. 14 is a plan view of an array substrate according to an embodiment in accordance with the present disclosure.
Figure 15:
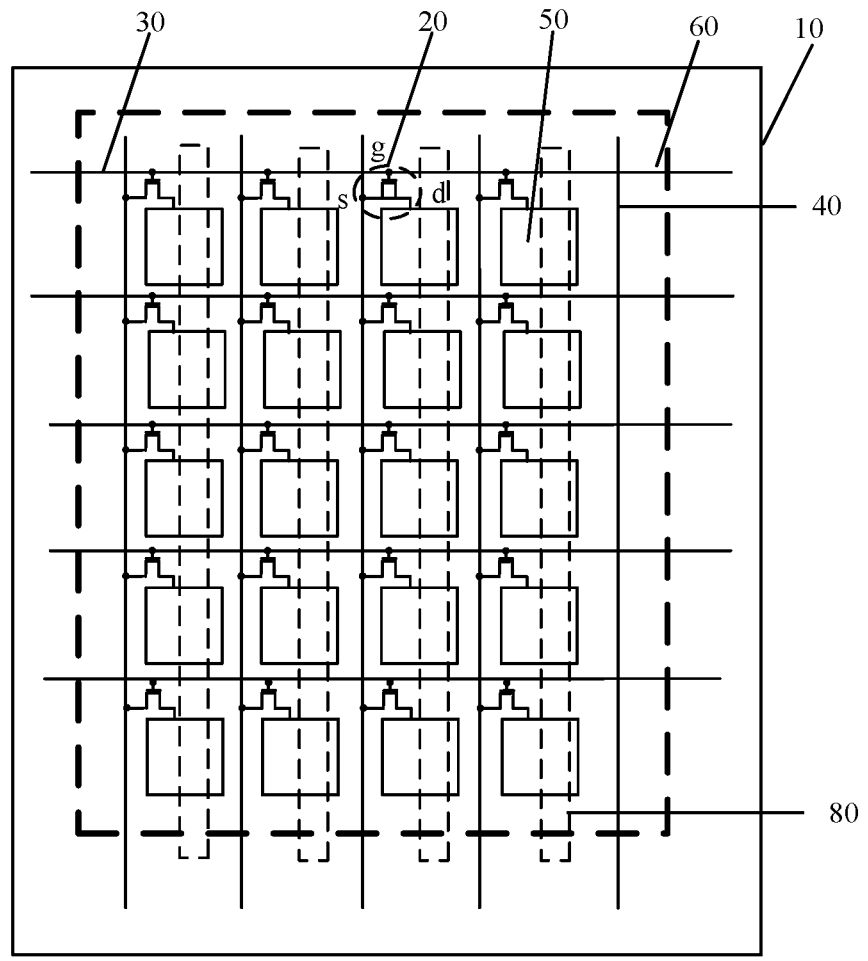
FIG. 15 is a plan view of an array substrate according to an embodiment in accordance with the present disclosure.
Figure 16:
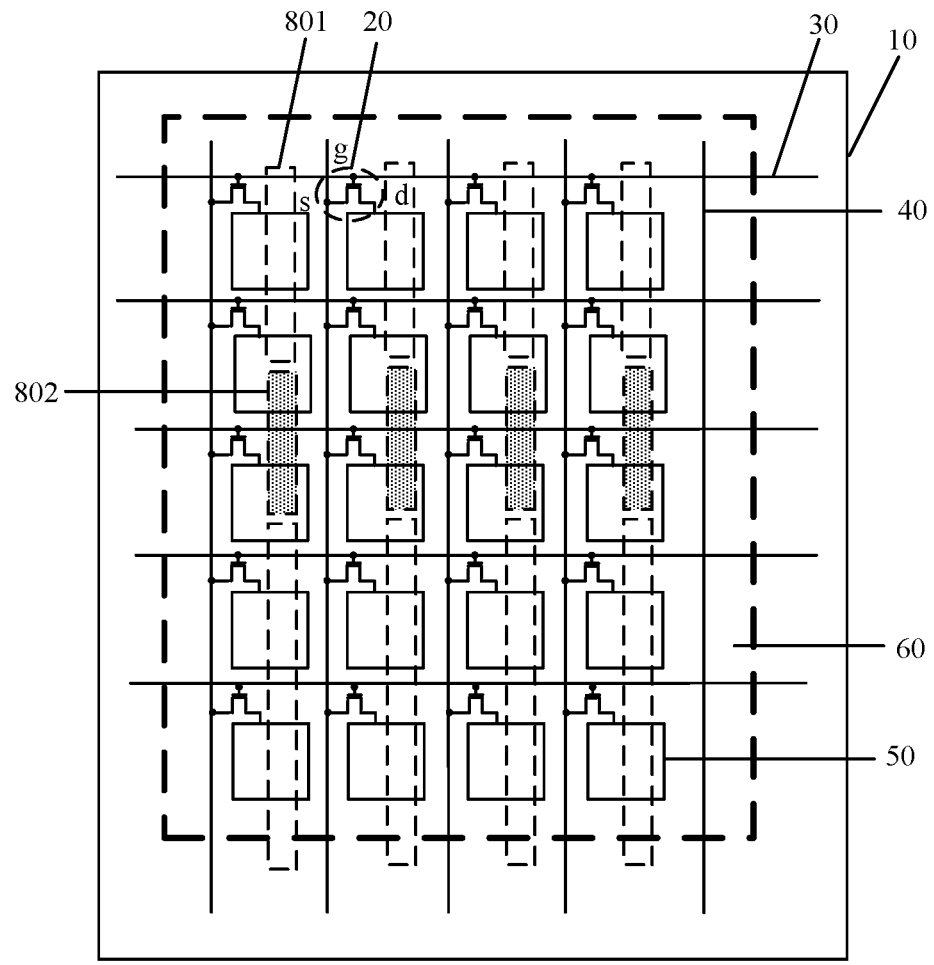
FIG. 16 is a plan view of an array substrate according to an embodiment in accordance with the present disclosure.

Based on any one embodiment described above, in an embodiment in accordance with the present disclosure, in a case that at least one buffer layer 71 has an opening 80, the opening 80 is a strip-shaped opening, as shown in FIG. 14, the strip-shaped opening extends in a first direction. It should be understood that in this embodiment, the first direction may be an extension direction of the gate lines as shown in FIG. 14, or may be an extension direction of the data lines as shown in FIG. 15. In a case that the first direction is the extension direction of the gate lines, stress accumulation in the extension direction of the data lines can be relieved when the array substrate is bent. In a case that the first direction is the extension direction of the data lines, stress accumulation in the extension direction of the gate lines can be relieved when the array substrate is bent.

Figure 17:
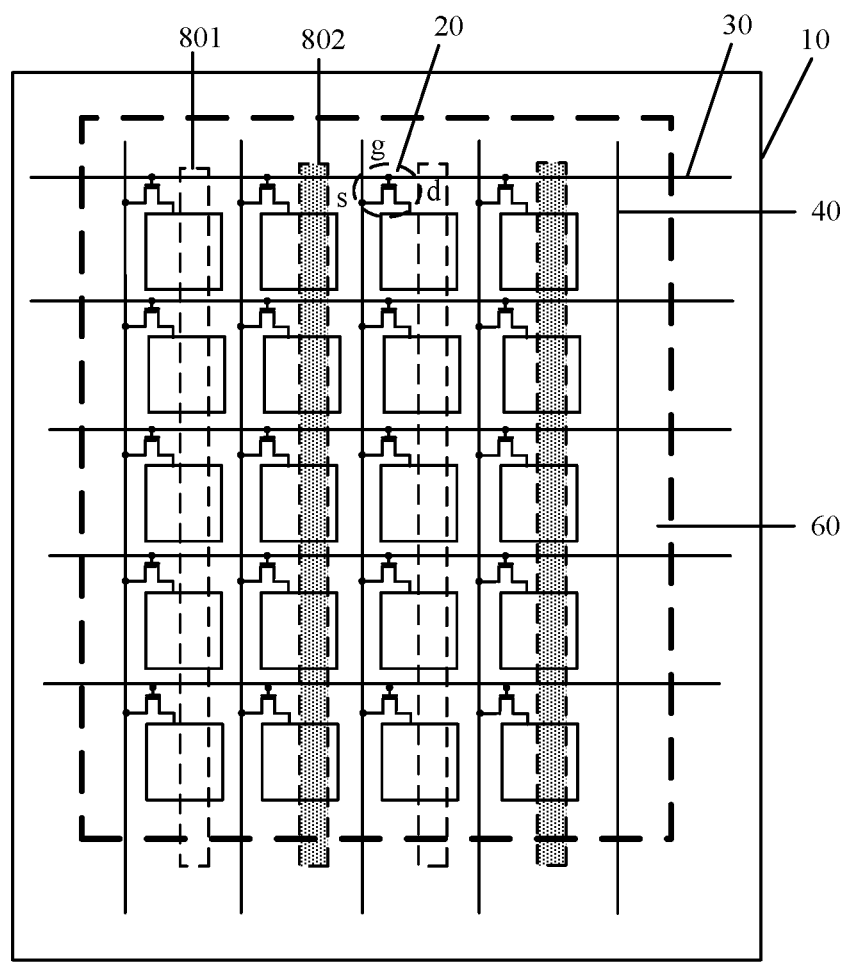
FIG. 17 is a plan view of an array substrate according to an embodiment in accordance with the present disclosure.
Figure 18:
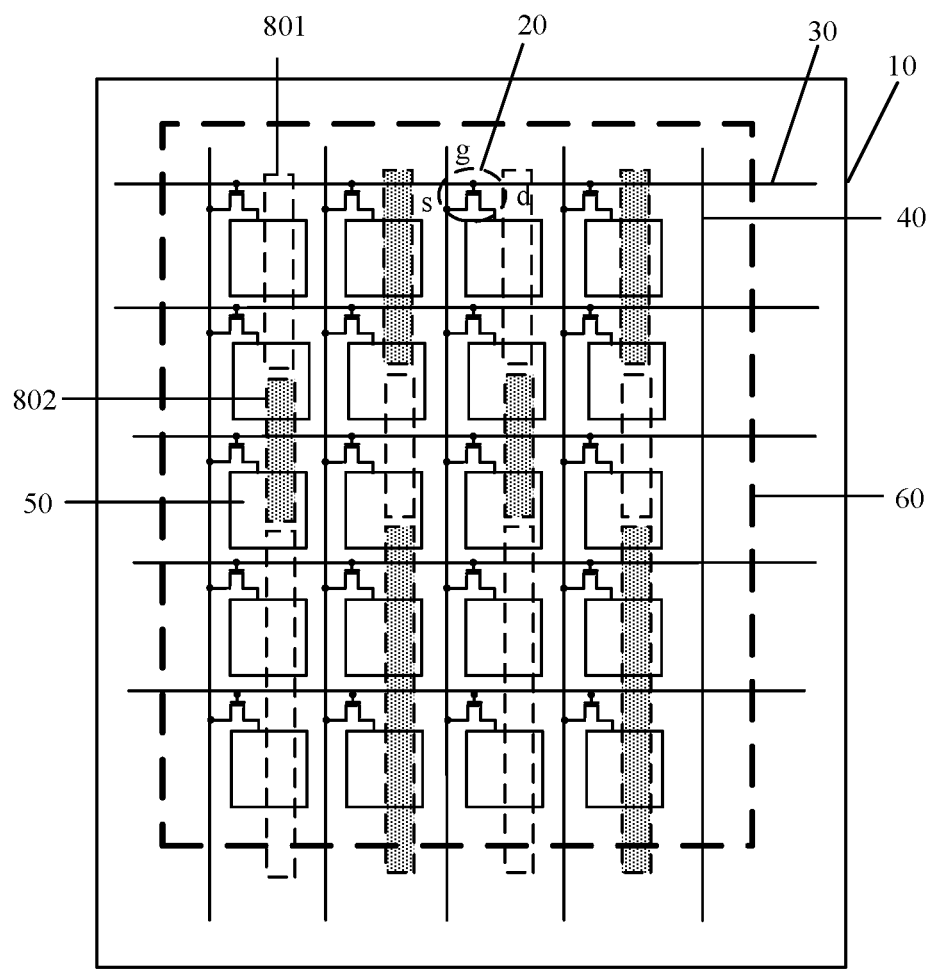
FIG. 18 is a plan view of an array substrate according to an embodiment in accordance with the present disclosure.

Based on the embodiments described above, in an embodiment shown in FIG. 16, strip-shaped openings of different inorganic layers are staggered in the first direction. That is, opening 801 and opening 802 are arranged at different inorganic layers, and are staggered in the first direction. In another embodiment in accordance with the present disclosure, as shown in FIG. 17, strip-shaped openings of different inorganic layers are staggered in a second direction. That is, opening 801 and opening 802 are arranged in different inorganic layers, and are staggered in the second direction. In another embodiment in accordance with the present disclosure, as shown in FIG. 18, strip-shaped openings of different inorganic layers are staggered both in the first direction and the second direction, that is, opening 801 and opening 802 are located in different inorganic layers, and are staggered both in the first direction and the second direction, which is not limited in the present disclosure, as the case may be.

It should be illustrated that in the embodiments described above, the second direction is the extension direction of the data lines in a case that the first direction is the extension direction of the gate lines, and the second direction is the extension direction of the gate lines in a case that the first direction is the extension direction of the data lines.

Based on the embodiments described above, in an optional embodiment in accordance with the present disclosure, as shown in FIG. 14 to FIG. 18, a width of the opening 80 is less than a width of the display pixel 50 in the second direction, so that one opening 80 is arranged at an area corresponding to each display pixel 50 in the second direction of the array substrate, thereby increasing the number of the openings 80 in the second direction to the greatest extent and relieving stress accumulation in the array substrate.

Based on the embodiments described above, in an embodiment in accordance with the present disclosure, a projection of the area corresponding to each of the display pixels 50 at least overlaps with a projection of at least one opening 80 of the multiple inorganic layers in a direction perpendicular with the plane where the array substrate is arranged, so that an opening 80 is arranged at the area corresponding to each display pixel 50, thereby relieving stress accumulation in the area corresponding to each display pixel 50, and avoiding a TFT and a light-emitting element corresponding to the display pixel 50 from being abnormal due to great stress accumulation at the area corresponding to the display pixel 50 and avoiding an influence on display quality of the array substrate for displaying.

It should be understood that, in these embodiments, the area corresponding to the display pixel 50 not only includes a transmissive area of the display pixel 50, but also includes an opaque area surrounding the display pixel 50. Areas corresponding to adjacent display pixels 50 are in direct contact with each other in the extension direction of scanning lines, and the areas corresponding to the adjacent display pixels 50 are in direct contact with each other in the extension direction of the data lines.

Figure 19:
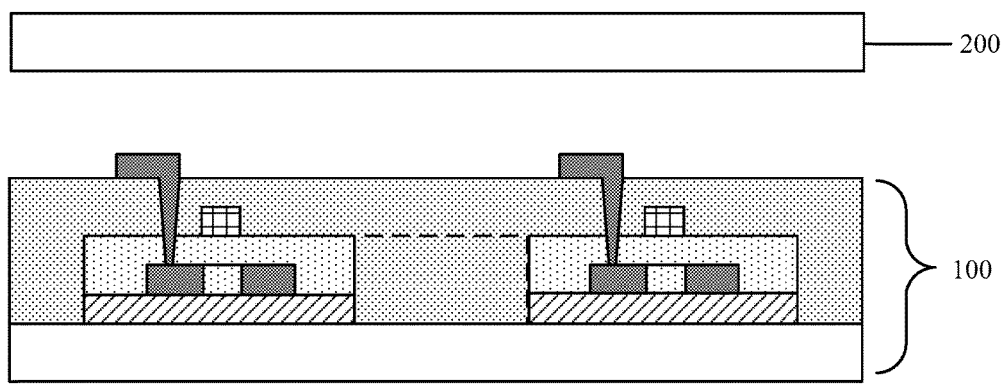
FIG. 19 is a schematic structural diagram of a flexible display panel according to an embodiment in accordance with the present disclosure.

Correspondingly, a flexible display panel is further provided by an embodiment in accordance with the present disclosure, the flexible display panel includes the array substrate according to any one embodiment described above. Specifically, as shown in FIG. 19, the flexible display panel includes the array substrate 100 according to any one embodiment described above and an opposing substrate 200 arranged oppositely with respect to the array substrate.

Based on the embodiments described above, in an embodiment in accordance with the present disclosure, in the stacked structure of the array substrate, a distance between adjacent openings 80 in a same inorganic layer in a direction perpendicular with an extension direction of the openings 80 is in a same order of magnitude as a thickness of the display panel, or is less than the thickness of the display panel, preferably approximately 150 μm or less than 150 μm. A width of the opening 80 in a direction perpendicular with the extension direction of the opening 80 is preferably greater than 3 μm, which is not limited in the present disclosure, depending on specific process, as long as the width can be realized in the process.

In summary, in the array substrate and the display panel including the array substrate provided by the embodiments in accordance with the present disclosure, at least one inorganic layer of the multiple inorganic layers has multiple openings at a position corresponding to the display area, to reduce stress accumulation in the stacked structure when the array substrate is bent, and a part of stress is released by the opening, thereby solving the problem that normal operation of the TFT and the light-emitting element is affected when the display panel including the array substrate is bent. The surface of the first side of the flexible substrate is completely covered by the stacked structure. That is, any position of the display area on the surface of the flexible substrate is covered by the stacked structure, no exposed area exists, so as to isolate the flexible substrate from water and oxygen in the external environment with the stacked structure, and avoid the display panel including the array substrate from being unable to operate normally since that water and oxygen in the external environment enters into the display area of the display panel.

Various parts of the specification are described in a progressive way, and each part lays emphasis on differences from other parts. For the same or similar parts between various parts, one may refer to the description of other parts.

According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. An array substrate, comprising:
a flexible substrate;
thin film transistors arranged on a first side of the flexible substrate, wherein each of the thin film transistors comprises a source, a drain, a channel and a gate, the gate being insulated from the source, the channel and the drain;
a first metal layer comprising gate lines electrically connected with the gates of the thin film transistors;
a second metal layer arranged on a side of the thin film transistors away from the flexible substrate, wherein the second metal layer comprises a plurality of metal lines, and the plurality of metal lines comprise data lines, the data lines being electrically connected with the source or the drain of each of the thin film transistors, the data lines intersecting with the gate lines of the first metal layer in an insulative manner to define a plurality of display pixels, and the data lines being configured to provide a data signal to the display pixels; and
a stacked structure arranged on the first side of the flexible substrate and covering a surface of the first side of the flexible substrate, wherein the stacked structure comprises a plurality of inorganic layers, the plurality of inorganic layers consisting of:
one or more buffer layers arranged between the flexible substrate and the thin film transistors,
one or more gate insulating layers arranged between a channel area and the gate, and
one or more first isolating layers arranged between the thin film transistors and the second metal layer, wherein
at least two inorganic layers of the plurality of inorganic layers each has a plurality of openings at a position corresponding to a display area;
wherein each of the plurality of openings has a front projection on a plane where the array substrate is arranged, and the front projection of the plurality of openings of one of the at least two inorganic layers does not overlap with the front projection of the plurality of openings of at least one of the other of the at least two inorganic layers;
wherein each of the openings is a strip-shaped opening, and a length of each of the strip-shaped openings in a first direction is greater than a length of the each of the strip-shaped openings in a second direction;
wherein in the second direction, an opening from the strip-shaped openings of one of the at least two inorganic layers is located between two adjacent openings from the strip-shaped openings of another layer of the at least two inorganic layers; and
wherein one of the first direction and the second direction is an extension direction of the gate lines, and the other of the first direction and the second direction is an extension direction of the data lines.

2. The array substrate according to claim 1, wherein each of the plurality of openings runs through an inorganic layer of the at least two inorganic layers.

3. The array substrate according to claim 1, wherein at least one buffer layer of the one or more buffer layers has an opening, and the front projection of the opening of the at least one buffer layer on the plane where the array substrate is arranged does not overlap with a front projection of the thin film transistors on the plane where the array substrate is arranged.

4. The array substrate according to claim 1, wherein at least one gate insulating layer of the one or more gate insulating layers has an opening, and the front projection of the opening of the at least one gate insulating layer on the plane where the array substrate is arranged does not overlap with a front projection of the thin film transistors on the plane where the array substrate is arranged.

5. The array substrate according to claim 1, wherein at least one first isolating layer of the one or more first isolating layers has an opening, the first metal layer and the second metal layer have a first overlapped area in which the first metal layer and the second metal layer are overlapped with each other in a direction perpendicular with the plane where the array substrate is arranged, and the front projection of the opening of the at least one first isolating layer on the plane where the array substrate is arranged does not overlap with a front projection of the first overlapped area on the plane where the array substrate is arranged.

6. The array substrate according to claim 1, wherein one or more passivation layers directly covering the second metal layer are arranged on a side of the second metal layer away from the one or more first isolating layers, at least one passivation layer of the one or more passivation layers has an opening, and a front projection of the opening of the at least one passivation layer on the plane where the array substrate is arranged does not overlap with a front projection of the plurality of metal lines of the second metal layer on the plane where the array substrate is arranged.

7. The array substrate according to claim 1, further comprising:
a second isolating layer arranged between the gates of the thin film transistors and the one or more first isolating layers; and
a capacitance metal layer arranged between the one or more first isolating layers and the second isolating layer, wherein the capacitance metal layer and the gate lines of the first metal layer form a capacitor, the first metal layer and the capacitance metal layer have a second overlapped area in which the first metal layer and the capacitance metal layer are overlapped with each other in a direction perpendicular with the plane where the array substrate is arranged,
wherein the second isolating layer has an opening, and a front projection of the opening of the second isolating layer on the plane where the array substrate is arranged does not overlap with a front projection of the second overlapped area on the plane where the array substrate is arranged.

8. The array substrate according to claim 1, wherein the at least two inorganic layers comprise at least one buffer layer of the one or more buffer layers and at least one gate insulating layer of the one or more gate insulating layers, and the front projection of each of the openings of the buffer layer and the gate insulating layer on the plane where the array substrate is arranged does not overlap with a front projection of the thin film transistors on the plane where the array substrate is arranged.

9. The array substrate according to claim 8, wherein the at least two inorganic layers further comprise at least one first isolating layer of the one or more first isolating layers, the first metal layer and the second metal layer have a first overlapped area in which the first metal layer and the second metal layer are overlapped with each other in a direction perpendicular with the plane where the array substrate is arranged, and the front projection of the opening of the at least one first isolating layer on the plane where the array substrate is arranged does not overlap with a front projection of the first overlapped area on the plane where the array substrate is arranged.

10. The array substrate according to claim 5, wherein a section shape of the opening of the at least one first isolating layer is a trapezoid, a length of a bottom side of the trapezoid close to the second metal layer is greater than a length of a bottom side of the trapezoid close to the thin film transistors, and a section shape of a portion of the second metal layer is a trapezoid, wherein the portion is laid at a bottom of the opening of the at least one first isolating layer and on a surface of the at least one first isolating layer.

11. The array substrate according to claim 1, wherein in the first direction, an opening from the strip-shaped openings of one of the at least two inorganic layers is located between two adjacent openings from the strip-shaped openings of another layer of the at least two inorganic layers.

12. An array substrate, comprising:
a flexible substrate;
thin film transistors arranged on a first side of the flexible substrate, wherein each of the thin film transistors comprises a source, a drain, a channel and a gate, the gate being insulated from the source, the channel and the drain;
a first metal layer comprising gate lines electrically connected with the gates of the thin film transistors;
a second metal layer arranged on a side of the thin film transistors away from the flexible substrate, wherein the second metal layer comprises a plurality of metal lines, and the plurality of metal lines comprise data lines, the data lines being electrically connected with the source or the drain of each of the thin film transistors, the data lines intersecting with the gate lines of the first metal layer in an insulative manner to define a plurality of display pixels, and the data lines being configured to provide a data signal to the display pixels; and
a stacked structure arranged on the first side of the flexible substrate and covering a surface of the first side of the flexible substrate, wherein the stacked structure comprises a plurality of inorganic layers, the plurality of inorganic layers consisting of:
one or more buffer layers arranged between the flexible substrate and the thin film transistors,
one or more gate insulating layers arranged between a channel area and the gate, and
one or more first isolating layers arranged between the thin film transistors and the second metal layer, wherein
at least two inorganic layers of the plurality of inorganic layers each has a plurality of openings at a position corresponding to a display area;
wherein each of the openings is a strip-shaped opening, and a length of each of the strip-shaped openings in a first direction is greater than a length of the each of the strip-shaped openings in a second direction;
wherein in the first direction, an opening from the strip-shaped openings of one of the at least two inorganic layers is located between two adjacent openings from the strip-shaped openings of another layer of the at least two inorganic layers; and
wherein the first direction is an extension direction of the gate lines or an extension direction of the data lines.

13. The array substrate according to claim 12, wherein a width of each of the openings is less than a width of each of the display pixels in the second direction, the second direction is the extension direction of the data lines or the extension direction of the gate lines, and the second direction is different from the first direction.

14. The array substrate according to claim 13, wherein a projection of each of the display pixels at least overlaps with a projection of at least one opening of the plurality of openings of the plurality of inorganic layers in a direction perpendicular with a plane where the array substrate is arranged.

15. A flexible display panel comprising an array substrate, wherein the array substrate comprises:
a flexible substrate;
thin film transistors arranged on a first side of the flexible substrate, wherein each of the thin film transistors comprises a source, a drain, a channel and a gate, the gate being insulated from the source, the channel and the drain;
a first metal layer comprising gate lines electrically connected with the gates of the thin film transistors;
a second metal layer arranged on a side of the thin film transistors away from the flexible substrate, wherein the second metal layer comprises a plurality of metal lines, and the plurality of metal lines comprise data lines, the data lines being electrically connected with the source or the drain of each of the thin film transistors, the data lines intersecting with the gate lines of the first metal layer in an insulative manner to define a plurality of display pixels, and the data lines being configured to provide a data signal to the display pixels; and
a stacked structure arranged on the first side of the flexible substrate and covering a surface of the first side of the flexible substrate, wherein the stacked structure comprises a plurality of inorganic layers, the plurality of inorganic layers consisting of:
one or more buffer layers arranged between the flexible substrate and the thin film transistors,
one or more gate insulating layers arranged between a channel area and the gate, and
one or more first isolating layers arranged between the thin film transistors and the second metal layer, wherein
at least two inorganic layers of the plurality of inorganic layers each has a plurality of openings at a position corresponding to a display area;
wherein each of the plurality of openings has a front projection on a plane where the array substrate is arranged, and the front projection of the plurality of openings of one of the at least two inorganic layers does not overlap with the front projection of the plurality of openings of at least one of the other of the at least two inorganic layers;
wherein each of the openings is a strip-shaped opening, and a length of each of the strip-shaped openings in a first direction is greater than a length of the each of the strip-shaped openings in a second direction;

wherein in the second direction, an opening from the strip-shaped openings of one of the at least two inorganic layers is located between two adjacent openings from the strip-shaped openings of another layer of the at least two inorganic layers; and wherein one of the first direction and the second direction is an extension direction of the gate lines, and the other of the first direction and the second direction is an extension direction of the data lines.

16. The flexible display panel according to claim 15, wherein a distance between adjacent openings in a same inorganic layer in a direction perpendicular with an extension direction of the plurality of openings is in a same order of magnitude as a thickness of the flexible display panel, or less than the thickness of the flexible display panel.

17. The flexible display panel according to claim 15, wherein each of the plurality of openings runs through an inorganic layer of the at least two inorganic layers.

18. The flexible display panel according to claim 15, wherein at least one buffer layer of the one or more buffer layers has an opening, and the front projection of the opening of the at least one buffer layer on the plane where the array substrate is arranged does not overlap with a front projection of the thin film transistors on the plane where the array substrate is arranged.

19. The flexible display panel according to claim 15, wherein at least one gate insulating layer of the one or more gate insulating layers has an opening, and the front projection of the opening of the at least one gate insulating layer on the plane where the array substrate is arranged does not overlap with a front projection of the thin film transistors on the plane where the array substrate is arranged.

20. The flexible display panel according to claim 15, wherein in the first direction, an opening from the strip-shaped openings of one of the at least two inorganic layers is located between two adjacent openings from the strip-shaped openings of another layer of the at least two inorganic layers.

* * * * *